(12) United States Patent
Yoshizawa et al.

(10) Patent No.: US 6,454,959 B1
(45) Date of Patent: Sep. 24, 2002

(54) PIEZOELECTRIC CERAMIC MATERIAL, SINTERED PIEZOELECTRIC CERAMIC COMPACT, AND PIEZOELECTRIC CERAMIC DEVICE

(75) Inventors: Isamu Yoshizawa, Omihachiman (JP); Katsuhiro Horikawa, Shiga-ken (JP)

(73) Assignee: Murata Manufacturing Co. Ltd. (JP)

( * ) Notice: Subject to any disclaimer, the term of this patent is extended or adjusted under 35 U.S.C. 154(b) by 0 days.

(21) Appl. No.: 09/931,496

(22) Filed: Aug. 16, 2001

(30) Foreign Application Priority Data

Aug. 18, 2000 (JP) ......................................... 2000-248439

(51) Int. Cl.[7] .................. C04B 35/00; C04B 35/462; C04B 35/485; C04B 35/472
(52) U.S. Cl. .................. 252/62.9 PZ; 501/134; 501/135; 501/136
(58) Field of Search .................. 252/62.9 PZ; 501/134, 501/135, 136

(56) References Cited

PUBLICATIONS

English abstract of JP55063890A, May 1980.*
English abstract of JP62046961A, Feb, 1987.*
English abstract of JP79026713B, Sep, 1979.*

* cited by examiner

*Primary Examiner*—Elizabeth D. Wood
(74) *Attorney, Agent, or Firm*—Dickstein, Shapiro, Morin & Oshinsky, LLP.

(57) ABSTRACT

A piezoelectric ceramic material is provided which can form a sintered piezoelectric ceramic compact having a low electromechanical coupling coefficient, a low resonant resistance and a low temperature dependence of the resonant frequency. The piezoelectric ceramic material is a solid solution having a primary component composed of $PbTiO_3$, $PbZrO_3$ and $Pb(Ma_XMd_Y)O_3$, in which Ma is at least one bivalent element or trivalent element, and Md is at least one pentavalent element or hexavalent element, and the ratio X/Y of the Ma content X to the Md content Y is larger than the stoichiometric ratio. Preferred is Ma being Mn, Md being at least one of Nb, Sb, Ta and W, and when the contents of Mn, Nb, Sb, Ta and W are represented by A, B, C, D and E, respectively, $0.525 \leq A/(B+C+D+2E) \leq 1$, and about 20 mole percent or less of the element Pb being replaced by at least one of Ca, Ba, Sr and La. Preferably, a sintered compact is obtained by firing this piezoelectric ceramic material in an oxygen atmosphere at an oxygen concentration of about 80% by volume or more is used in an unsaturated polarized state having an electromechanical coupling coefficient corresponding to about 80% or less of that of a sintered compact in a saturated polarized state.

19 Claims, 3 Drawing Sheets

PIEZOELECTRIC CERAMIC MATERIAL, SINTERED PIEZOELECTRIC CERAMIC COMPACT, AND PIEZOELECTRIC CERAMIC DEVICE

BACKGROUND OF THE INVENTION

1. Field of the Invention

The present invention relates to piezoelectric ceramic materials, sintered piezoelectric ceramic compacts using the same and piezoelectric ceramic devices formed of the sintered piezoelectric ceramic compacts, and more particularly, relates to a sintered piezoelectric ceramic compact advantageously used for forming a piezoelectric ceramic device which is required to have a relatively low electromechanical coupling coefficient and superior temperature stability of the resonant frequency, and to a piezoelectric ceramic material for forming the sintered piezoelectric ceramic compact.

2. Description of the Related Art

Heretofore, sintered piezoelectric ceramic compacts formed by firing a piezoelectric ceramic material composed of lead titanate zirconate, i.e., $PbZrO_3$-$PbTiO_3$, and a lead-based complex perovskite compound, i.e., $Pb(Ma_xMd_y)O_3$, dissolved therein (in which Ma is at least one divalent element or trivalent element, and Md is at least one pentavalent element or hexavalent element) have been used for forming filters or oscillators using bulk waves or surface waves.

Since a sintered piezoelectric ceramic compact formed by firing a piezoelectric ceramic material containing Mn as Ma, which is an acceptor component, has a relatively low loss among sintered lead titanate zirconate-based piezoelectric compacts, the sintered piezoelectric ceramic compact described above has been widely used in various applications.

In addition, trials for variously modifying the compositions of piezoelectric ceramic materials have been conducted in order to improve the resonant properties of these sintered piezoelectric ceramic compacts.

For example, it has been disclosed in Japanese Unexamined Patent Application Publication No. 5-327397 that when a piezoelectric ceramic material represented by the formula $(Pb_{1-x}Me_x)\{(Mn_{1/3}Nb_{2/3})_aTi_bZr_c\}O_3$ is used, in which Me is at least one selected from the group consisting of Ca, Ba and Sr, and x, a, b and c satisfy $0.005 \leq x \leq 0.10$, $0.01 \leq a \leq 0.14$, $0.40 \leq b \leq 0.60$, $0.26 \leq c \leq 0.59$, and $a+b+c=1.00$, a surface wave device can be produced having superior resonant properties, temperature dependence thereof, and heat stability.

In addition, in Japanese Unexamined Patent Application Publication No. 5-24916, a material is disclosed which contains at least one of $SiO_2$ at a content of from 0.005 to 0.040 wt % and $Al_2O_3$ at a content of from 0.005 to 0.040 wt % as a $\{PbSr\}\{(TiZr)(MnNb)\}O_3$-based piezoelectric ceramic material which reduces variation in electrical properties.

Sintered piezoelectric compacts formed of these piezoelectric materials have relatively superior properties, such as resonant properties and temperature stability thereof, and hence, they can be advantageously used for various industrial applications.

However, when a conventional sintered piezoelectric ceramic compact having relatively superior temperature properties, as described above, is used for forming a narrow bandwidth filter, which is required to have better temperature properties than a wide bandwidth filter, a problem may occur in some cases in that the central transmission wavelength in the filter varies considerably.

In addition, since the conventional sintered piezoelectric ceramic compact described above has a relatively high electromechanical coupling coefficient in a state in which the degree of polarization is saturated, and hence, in the state described above, there is a problem in that a narrow bandwidth filter or a highly precise oscillator, both of which are required to have a small difference between the resonant frequency and the antiresonant frequency, cannot be provided.

Furthermore, in order to decrease the electromechanical coupling coefficient when the degree of polarization is unsaturated, degradation of the resonant resistance or an increase in variation of the degree of polarization occur, and as a result, insertion losses of filters may be increased, oscillations of oscillators may become unstable or the production yield may be decreased.

In order to solve the problems described above, it has been disclosed that the variation of degree of polarization can be decreased by appropriately designing a polarization method for polarizing piezoelectric compacts in U.S. Pat. Nos. 2,783,022, 2,890,863, and Japanese Examined Patent Application Publication No. 7-105684.

According to the methods disclosed in these publications, the degree of polarization can be effectively decreased; however, degradation of the resonant resistance cannot be avoided when the degree of polarization is decreased. Consequently, when the methods mentioned above are applied to a piezoelectric compact for forming a filter or an oscillator, the insertion loss of the filter may be increased, or the oscillation of the oscillator may become unstable in some cases. In addition, a polarization step must be performed at least two times in manufacturing piezoelectric products, and as a result, the time required for manufacturing the piezoelectric products is disadvantageously the prolonged.

SUMMARY OF THE INVENTION

Accordingly, an object of the present invention is to solve the problems described above, and more particularly, is to provide a piezoelectric ceramic material having preferable properties for designing narrow bandwidth filters or highly precise oscillators, a sintered piezoelectric ceramic compact formed by firing the piezoelectric ceramic material and a piezoelectric ceramic device comprising the sintered piezoelectric ceramic compact.

A piezoelectric ceramic material according to the present invention comprises a solid solution having a primary component composed of $PbTiO_3$, $PbZrO_3$ and $Pb(Ma_xMd_y)O_3$, in which Ma is at least one selected from the group consisting of bivalent elements and trivalent elements, and Md is at least one selected from the group consisting of pentavalent elements and hexavalent elements, wherein the solid solution has a tetragonal crystal system, and a ratio X/Y, which is the ratio of the Ma content X to the Md content Y, is larger than the stoichiometric ratio.

When a piezoelectric ceramic material having a predetermined composition and a predetermined crystal system is specifically selected, superior temperature stability of the resonant frequency of a sintered piezoelectric ceramic compact which is formed by firing the piezoelectric ceramic material described above can be obtained. Compared to the case in which the X/Y coincides with the stoichiometric ratio, the temperature coefficient of the resonant frequency can be decreased. When the crystal system is other than a tetragonal crystal system, even when the X/Y is increased to more than the stoichiometric ratio, the effect of improving the temperature properties cannot be obtained.

In the piezoelectric ceramic material of the present invention, it is preferable that Ma be Mn, and Md be at least one selected from the group consisting of Nb, Sb, Ta and W. When the contents of Mn, Nb, Sb, Ta and W are represented by A, B, C, D and E, respectively, the ratio of acceptor to donor, i.e., A/(B+C+D+2E), preferably satisfies $0.525 \leq A/(B+C+D+2E) \leq 1$ on a molar basis.

When $0.525 \leq A/(B+C+D+2E) \leq 1$ is satisfied, the effect of improving the temperature stability of the resonant frequency of the sintered piezoelectric ceramic compact obtained by firing the piezoelectric ceramic material can be more significant, and a polarization treatment can be more easily performed. When A/(B+C+D+2E) is less than 0.525, the effect of improving temperature properties cannot be obtained, and in contrast, when A/(B+C+D+2E) is more than 1, the electric insulating properties of the sintered piezoelectric ceramic compact is degraded, and a polarization treatment may be difficult to perform in some cases.

In the piezoelectric ceramic material of the present invention, it is preferable that from more than zero to about 20 mole percent of the element Pb contained in the primary component described above be replaced by at least one selected from the group consisting of Ca, Ba, Sr and La.

When replacement is performed as described above, the effects of decreasing variations in electromechanical coupling coefficient, resonant frequency, and degree of polarization of the sintered piezoelectric ceramic compact obtained by firing the piezoelectric ceramic material can be more significant compared to the case in which replacement is not performed. In addition, when about 1 to 4 mole percent of the Pb is replaced, the effect of decreasing variations can be further improved. In this connection, when more than about 20 mole percent of the element Pb is replaced, the Curie temperature of the sintered piezoelectric ceramic compact is decreased, and as a result of the temperature used in machining or processing for forming a piezoelectric ceramic device, the piezoelectric properties of the sintered piezoelectric ceramic compact may disappear in some cases.

In the piezoelectric ceramic material of the present invention, about 0.003 to 0.1 parts by weight of $SiO_2$ and about 0.003 to 0.1 parts by weight of $Al_2O_3$ are preferably contained with respect to 100 parts by weight of the primary component.

The contents of $SiO_2$ and $Al_2O_3$ described above serve to improve the strength of the sintered piezoelectric ceramic compact obtained by firing the piezoelectric ceramic material. When the contents of $SiO_2$ and $Al_2O_3$ are increased to more than about 0.1 parts by weight, respectively, undesired resonant resistance of the sintered piezoelectric ceramic compact may be increased in some cases.

The present invention can also be applied to a sintered piezoelectric ceramic compact formed by firing the piezoelectric ceramic material described above. In particular, this sintered piezoelectric ceramic compact is obtained by firing the piezoelectric ceramic material of the present invention in an oxygen atmosphere at an oxygen concentration of about 80 percent by volume or more.

The sintered piezoelectric ceramic compact is preferably used in an unsaturated polarized state having an electromechanical coupling coefficient corresponding to about 80% or less of that of a sintered piezoelectric ceramic compact in a saturated polarized state.

The present invention can also be applied to a piezoelectric ceramic device comprising the sintered piezoelectric ceramic compact described above and electrodes provided on surfaces of the sintered piezoelectric ceramic compact. As such piezoelectric ceramic devices, for example, a filter, a trap device, or an oscillator may be mentioned.

DESCRIPTION OF THE PREFERRED EMBODIMENTS

Hereinafter, particular examples of a piezoelectric ceramic device according to the present invention will be described.

Figure 1:
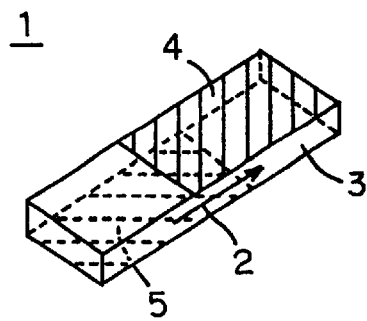
FIG. 1 is a perspective view showing an oscillator as a piezoelectric ceramic device according to an embodiment of the present invention.

FIG. 1 is a perspective view showing an oscillator 1 as a piezoelectric ceramic device according to an embodiment of the present invention.

The oscillator 1 shown in FIG. 1, which uses a shear vibration mode, comprises a sintered piezoelectric ceramic compact 3 in the form of a rectangular plate processed by a polarization treatment in the direction shown by arrow 2, and on individual major surfaces of the sintered piezoelectric ceramic compact 3, vibration electrodes 4 and 5 are provided. The vibration electrodes 4 and 5 are provided at end portion sides opposite to each other in the longitudinal direction of the sintered piezoelectric ceramic compact 3.

In the oscillator 1 described above, when a voltage is applied between the vibration electrodes 4 and 5, the sintered piezoelectric ceramic compact 3 is resonated in accordance with a shear vibration mode.

Figure 2:
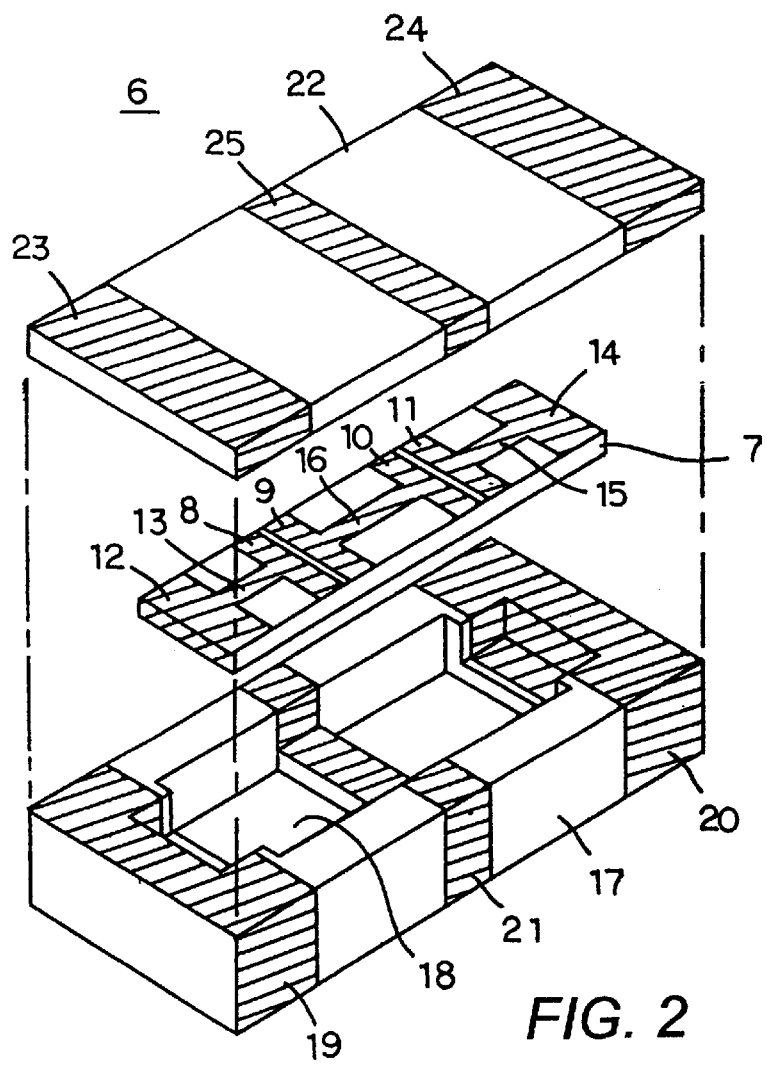
FIG. 2 is an exploded perspective view showing a filter as a piezoelectric ceramic device according to another embodiment of the present invention.

FIG. 2 is an exploded perspective view showing a filter 6 as a piezoelectric ceramic device according to an embodiment of the present invention.

The filter 6 comprises a sintered piezoelectric ceramic compact 7 in the form of a rectangular plate. On one major surface of the sintered piezoelectric ceramic compact 7, a first set of vibration electrodes 8 and 9 and a second set of vibration electrodes 10 and 11 are formed. The vibration electrode 8 is connected to a lead electrode 12 formed at an end portion in the longitudinal direction of the sintered piezoelectric ceramic compact 7 via a lead line 13, and the vibration electrode 11 is connected to a lead electrode 14 formed at the other end portion in the longitudinal direction of the sintered piezoelectric ceramic compact 7 via a lead line 15. The vibration electrodes 9 and 10 are connected to each other via a relay line 16.

On the other major surface of the sintered piezoelectric ceramic compact 7, even though not shown in the figure, a ground-side vibration electrode opposing both vibration electrodes 8 and 9 of the first set and a ground-side vibration electrode opposing both vibration electrodes 10 and 11 of the second set are formed, and these ground-side vibration electrodes are both connected to a ground-side lead electrode formed at a central portion in the longitudinal direction of the sintered piezoelectric ceramic compact 7.

The sintered piezoelectric ceramic compact 7 described above is received in a recess 18 formed in a ceramic case 17. In the ceramic case 17, terminal electrodes 19, 20 and 21 are formed so as to extend from the recess 18 to the external surfaces.

In addition, the ceramic case 17 is covered with a lid 22, and on the lid 22, terminal electrodes 23, 24 and 25 are formed at positions corresponding to those of the terminal electrodes 19, 20 and 21, respectively.

The lead electrode 12 formed on the sintered piezoelectric ceramic compact 7 is connected to the terminal electrode 19 in the ceramic case 17 by a conductive adhesive not shown in the figure. In a manner similar to the above, the lead electrode 14 is connected to the terminal electrode 20 by a conductive adhesive. In addition, the ground-side lead electrodes of the sintered piezoelectric ceramic compact 7, which are not shown in the figure, are connected to the terminal electrode 21 by a conductive adhesive.

In addition, the lid 22 described above is bonded to the ceramic case 17 by an adhesive so as to cover the opening of the recess 18. Accordingly, a closed space is formed in the recess 18 in which the sintered piezoelectric ceramic compact 7 is received. Furthermore, the terminal electrodes 19, 20 and 21 are electrically connected to the terminal electrodes 23, 24 and 25, respectively.

When the filter 6 described above is used, the terminal electrodes 19 or 23 and 20 or 24 are connected to signal lines, and the terminal electrode 21 or 25 is connected to the ground.

In this filter 6, a cavity is formed around the sintered piezoelectric ceramic compact 7 in the case in which a thickness extensional vibration mode is used, and on the other hand, when a shear vibration mode is used, a damping material composed of, for example, a silicone rubber is provided so as to cover at least a vibration area of the sintered piezoelectric ceramic compact 7 in order to damp unnecessary vibration.

Figure 3:
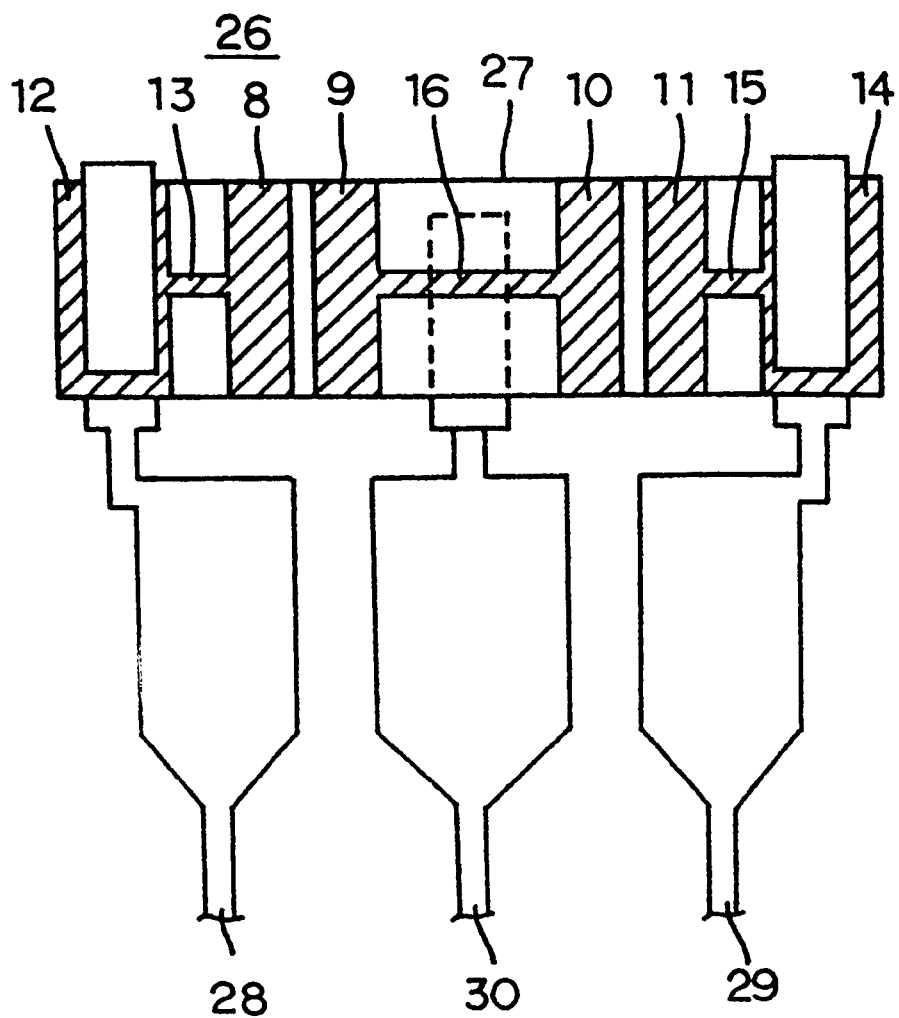
FIG. 3 is a front view showing a filter as a piezoelectric ceramic device according to still another embodiment of the present invention.

FIG. 3 is a front view showing a filter 26 as a piezoelectric ceramic device according to another embodiment of the present invention. The filter 26 comprises a sintered piezoelectric ceramic compact 27 having a structure substantially equivalent to that of the sintered piezoelectric ceramic compact 7 shown in FIG. 2. The same reference numerals of the constituents shown in FIG. 2 designate the equivalent constituents provided for the sintered piezoelectric ceramic compact 27, and duplicate descriptions thereof are omitted.

On one major surface of the sintered piezoelectric ceramic compact 27, as is the case of the sintered piezoelectric ceramic compact 7 shown in FIG. 2, vibration electrodes 8 to 11, lead electrodes 12 and 14, lead lines 13 and 15, and a relay line 16 are provided, and on the other major surface not shown in the figure, ground-side vibration electrodes and a ground-side lead electrode are provided.

In addition, a lead terminal 28 is connected to the lead electrode 12 on the sintered piezoelectric ceramic compact 27 by soldering or the like, and in a manner similar to that, a lead terminal 29 is connected to the lead electrode 14. Furthermore, a lead terminal 30 is connected to the ground-side lead electrode not shown in the figure of the sintered piezoelectric ceramic compact 27.

When the filter 26 described above is used, the lead terminals 28 and 29 are connected to signal lines, and the lead terminal 30 is connected to the ground.

In addition, when a shear vibration mode is used in the filter 26, a damping material composed of, for example, a silicone rubber, which is not shown in the figure, is provided on a surface of the sintered piezoelectric ceramic compact 27.

In order to form the sintered piezoelectric ceramic compacts 3, 7 and 27 provided in the piezoelectric ceramic devices, such as the oscillator 1 and the filters 6 and 26, a sintered piezoelectric ceramic compact obtained by firing the piezoelectric ceramic material of the present invention is used.

The sintered piezoelectric ceramic compact is preferably used in an unsaturated polarized state in which the electromechanical coupling coefficient corresponds to about 80% or less of that obtained in a saturated polarized state. The reason for this is that a method for decreasing the degree of polarization is to be used in order to obtain a low electromechanical coupling coefficient required for, for example, a narrow bandwidth filter.

In addition, a sintered piezoelectric ceramic compact formed by firing the piezoelectric ceramic material in an atmosphere of about 80 percent by volume or more of oxygen is preferable. By performing firing in this oxygen atmosphere described above, even when the degree of polarization is decreased so that the electromechanical coupling coefficient is about 80% or less of that in a saturated polarized state, the resonant resistance is not significantly increased. Accordingly, for example, when a filter is formed by using the sintered piezoelectric ceramic compact described above, the insertion loss of this filter can be controlled so as not to be significantly increased.

The piezoelectric ceramic material for forming the sintered piezoelectric ceramic compact is a solid solution having a primary component composed of $PbTiO_3$, $PbZrO_3$ and $Pb(Ma_xMd_y)O_3$ (in which Ma is at least one divalent element or trivalent element, and Md is at least one pentavalent element or hexavalent element), wherein the crystal system of this solid solution is a tetragonal crystal system, and the ratio X/Y, i.e., a ratio of the Ma content X to the Md content Y, is larger than the stoichiometric ratio.

When the ratio X/Y exceeds the stoichiometric ratio, compared to the case in which the ratio X/Y is equal to or smaller than the stoichiometric ratio, superior temperature properties required for narrow bandwidth filters can be obtained. The reason the crystal system of this solid solution is limited to the tetragonal crystal system is that when the crystal system is other than the tetragonal crystal system, the effect of improving the temperature properties cannot be obtained even when the ratio X/Y is larger than the stoichiometric ratio.

In the piezoelectric ceramic material described above, it is preferable that Ma be Mn and that Md be at least one element selected from the group consisting of Nb, Sb, Ta and W. When the content of Mn is represented by A, and the contents of Nb, Sb, Ta and W are represented by B, C, D and E, respectively, $0.525 \leq A/(B+C+D+2E) \leq 1$ is preferably satisfied on a molar ratio.

The reason $0.525 \leq A/(B+C+D+2E) \leq 1$ is preferable is that when $A/(B+C+D+2E)$ is less than 0.525, the effect of improving the temperature properties cannot be obtained and when $A/(B+C+D+2E)$ is more than 1, the electrical insulating properties of the sintered piezoelectric ceramic compact obtained by the piezoelectric ceramic material are degraded, and a polarization treatment is difficult to perform.

In addition, when from more than zero to about 20 mole percent of the element Pb in the primary component of the piezoelectric ceramic material described above is replaced by at least one selected from the group consisting of Ca, Ba, Sr and La, variations in electromechanical coupling coefficient, resonant frequency, and degree of polarization can be decreased. In particular, when about 1 to 4 mole percent of the element Pb is replaced, the effect of decreasing the variation can be further improved.

When more than about 20 mole percent of the element Pb is replaced, the Curie temperature of the sintered piezoelectric ceramic compact is decreased, and as a consequence of the temperature used in machining or processing for forming a piezoelectric ceramic device, e.g., the temperature used in a solder reflow step, the piezoelectric properties of the sintered piezoelectric ceramic compact may disappear in some cases.

Furthermore, when about 0.003 to 0.1 parts by weight of $SiO_2$ and about 0.003 to 0.1 parts by weight of $Al_2O_3$ with respect to 100 parts by weight of the primary component are contained in the piezoelectric ceramic material, the strength of the sintered piezoelectric ceramic compact can be improved. When the content of $SiO_2$ and $Al_2O_3$ are more than about 0.1 parts by weight, respectively, the resonant resistance may be undesirably increased in some cases.

Hereinafter, the piezoelectric ceramic material and the sintered piezoelectric ceramic compact according to the present invention will be described with reference to particularly detailed examples.

EXAMPLES

As stating materials for the piezoelectric ceramic material, $Pb_3O_4$, $SrCO_3$, $CaCO_3$, $BaCO_3$, $La_2O_3$, $ZrO_2$, $TiO_2$, $MnCO_3$, $Nb_2O_5$, $Sb_2O_3$, $Ta_2O_5$, $WO_3$, $Al_2O_3$ and $SiO_2$ were prepared.

Next, after these starting materials were mixed and pulverized so as to have compositions in accordance with those shown in Tables 1 to 3, calcining was performed at a temperature from 800 to 1,100° C. for 1 to 4 hours. The calcined mixtures thus obtained were pulverized, whereby samples 1-70 shown in Tables 1-3 of piezoelectric ceramic materials comprising a solid solution were obtained.

In Tables 1 to 3, the compositions of the piezoelectric ceramic materials of the test pieces are represented by the formula $Pb_aZr_bTi_cMa_xMd_yO_3+\alpha SiO_2+\beta Al_2O_3$, in which Pb content a, Zr content b, Ti content c, Mn content A, Nb content B, Sb content C, Ta content D, and W content E are shown on a molar ratio, and "Pb replacing element/replacing content" is shown in mole percent with respect to 100 mole percent of Pb. In addition, the $SiO_2$ content $\alpha$ and $Al_2O_3$ content $\beta$ are shown in parts by weight with respect to 100 parts by weight of $Pb_aZr_bTi_cMa_xMd_yO_3$.

The crystal system of the solid solution of each sample is also shown in Tables 1 to 3. In this connection, "MPB" means a crystal phase boundary between a tetragonal and a rhombohedral crystal system.

In Tables 1 to 3, sample Nos. marked by * correspond to comparative examples which are out of the scope of the present invention.

Respective samples 1-70 of the obtained piezoelectric ceramic materials were pelletized by adding an appropriate organic binder, and molded parts in the form of a rectangular parallelepiped of 20 mm×30 mm ×8.5 mm were formed by press molding.

TABLE 1

| Sample No. | Pb Replacing Element | Content of Element (Molar %) | Pb Content a (Molar Ratio) | Zr Content b (Molar Ratio) | Ti Content c (Molar Ratio) | Mn Content A (Molar Ratio) | Nb Content B (Molar Ratio) | Sb Content C (Molar Ratio) | Ta Content D (Molar Ratio) | W Content E (Molar Ratio) | A/ (B + C + D + 2E) | $SiO_2$ Content α (Parts by Weight) | $Al_2O_3$ Content β (Parts by Weight) | Crystal System |
|---|---|---|---|---|---|---|---|---|---|---|---|---|---|---|
| 1* | — | — | 100 | 42 | 53 | 1.500 | 3.000 | — | — | — | 0.500 | — | — | Tetragonal |
| 2 | — | — | 100 | 42 | 53 | 1.530 | 3.000 | — | — | — | 0.510 | — | — | Tetragonal |
| 3 | — | — | 100 | 42 | 53 | 1.575 | 3.000 | — | — | — | 0.525 | — | — | Tetragonal |
| 4 | — | — | 100 | 42 | 53 | 2.000 | 3.000 | — | — | — | 0.667 | — | — | Tetragonal |
| 5 | — | — | 100 | 42 | 53 | 3.000 | 3.000 | — | — | — | 1.000 | — | — | Tetragonal |
| 6 | — | — | 100 | 42 | 53 | 3.100 | 3.000 | — | — | — | 1.033 | — | — | Tetragonal |
| 7* | — | — | 100 | 42 | 53 | 1.500 | — | 3.000 | — | — | 0.500 | — | — | Tetragonal |
| 8 | — | — | 100 | 42 | 53 | 1.530 | — | 3.000 | — | — | 0.510 | — | — | Tetragonal |
| 9 | — | — | 100 | 42 | 53 | 1.575 | — | 3.000 | — | — | 0.525 | — | — | Tetragonal |
| 10 | — | — | 100 | 42 | 53 | 2.000 | — | 3.000 | — | — | 0.667 | — | — | Tetragonal |
| 11 | — | — | 100 | 42 | 53 | 3.000 | — | 3.000 | — | — | 1.000 | — | — | Tetragonal |
| 12 | — | — | 100 | 42 | 53 | 3.100 | — | 3.000 | — | — | 1.033 | — | — | Tetragonal |
| 13* | — | — | 100 | 42 | 53 | 1.500 | — | — | 3.000 | — | 0.500 | — | — | Tetragonal |
| 14 | — | — | 100 | 42 | 53 | 1.530 | — | — | 3.000 | — | 0.510 | — | — | Tetragonal |
| 15 | — | — | 100 | 42 | 53 | 1.575 | — | — | 3.000 | — | 0.525 | — | — | Tetragonal |
| 16 | — | — | 100 | 42 | 53 | 2.000 | — | — | 3.000 | — | 0.667 | — | — | Tetragonal |
| 17 | — | — | 100 | 42 | 53 | 3.000 | — | — | 3.000 | — | 1.000 | — | — | Tetragonal |
| 18 | — | — | 100 | 42 | 53 | 3.100 | — | — | 3.000 | — | 1.033 | — | — | Tetragonal |
| 19* | — | — | 100 | 42 | 53 | 1.500 | 1.500 | 1.500 | — | — | 0.500 | — | — | Tetragonal |
| 20 | — | — | 100 | 42 | 53 | 1.530 | 1.500 | 1.500 | — | — | 0.510 | — | — | Tetragonal |
| 21 | — | — | 100 | 42 | 53 | 1.575 | 1.500 | 1.500 | — | — | 0.525 | — | — | Tetragonal |
| 22 | — | — | 100 | 42 | 53 | 2.000 | 1.500 | 1.500 | — | — | 0.667 | — | — | Tetragonal |
| 23 | — | — | 100 | 42 | 53 | 3.000 | 1.500 | 1.500 | — | — | 1.000 | — | — | Tetragonal |
| 24 | — | — | 100 | 42 | 53 | 3.100 | 1.500 | 1.500 | — | — | 1.033 | — | — | Tetragonal |

TABLE 2

| Sample No. | Pb Replacing Element Element | Pb Replacing Element Content of Element (Molar %) | Pb Content a (Molar Ratio) | Zr Content b (Molar Ratio) | Ti Content c (Molar Ratio) | Mn Content A (Molar Ratio) | Nb Content B (Molar Ratio) | Sb Content C (Molar Ratio) | Ta Content D (Molar Ratio) | W Content E (Molar Ratio) | A/ (B + C + D + 2E) | SiO$_2$ Content α (Parts by Weight) | Al$_2$O$_3$ Content β (Parts by Weight) | Crystal System |
|---|---|---|---|---|---|---|---|---|---|---|---|---|---|---|
| 25* | — | — | 100 | 41 | 52 | 3.000 | — | — | — | 3.000 | 0.500 | — | — | Tetragonal |
| 26 | — | — | 100 | 41 | 52 | 3.060 | — | — | — | 3.000 | 0.510 | — | — | Tetragonal |
| 27 | — | — | 100 | 41 | 52 | 3.150 | — | — | — | 3.000 | 0.525 | — | — | Tetragonal |
| 28 | — | — | 100 | 41 | 52 | 4.000 | — | — | — | 3.000 | 0.667 | — | — | Tetragonal |
| 29 | — | — | 100 | 41 | 52 | 6.000 | — | — | — | 3.000 | 1.000 | — | — | Tetragonal |
| 30 | — | — | 100 | 41 | 52 | 6.200 | — | — | — | 3.000 | 1.033 | — | — | Tetragonal |
| 31 | Sr | 1 | 99 | 42 | 53 | 2.000 | 3.000 | — | — | — | 0.667 | — | — | Tetragonal |
| 32 | Sr | 2 | 98 | 42 | 53 | 2.000 | 3.000 | — | — | — | 0.667 | — | — | Tetragonal |
| 33 | Sr | 4 | 96 | 42 | 53 | 2.000 | 3.000 | — | — | — | 0.667 | — | — | Tetragonal |
| 34 | Sr | 6 | 94 | 42 | 53 | 2.000 | 3.000 | — | — | — | 0.667 | — | — | Tetragonal |
| 35 | Sr | 10 | 90 | 42 | 53 | 2.000 | 3.000 | — | — | — | 0.667 | — | — | Tetragonal |
| 36 | Sr | 20 | 80 | 42 | 53 | 2.000 | 3.000 | — | — | — | 0.667 | — | — | Tetragonal |
| 37 | Sr | 22 | 78 | 42 | 53 | 2.000 | 3.000 | — | — | — | 0.667 | — | — | Tetragonal |
| 38 | Ca | 2 | 98 | 42 | 53 | 2.000 | 3.000 | — | — | — | 0.667 | — | — | Tetragonal |
| 39 | Ba | 2 | 98 | 42 | 53 | 2.000 | 3.000 | — | — | — | 0.667 | — | — | Tetragonal |
| 40 | La | 2 | 98 | 42 | 53 | 2.000 | 3.000 | — | — | — | 0.667 | — | — | Tetragonal |
| 41 | — | — | 100 | 42 | 53 | 2.000 | 3.000 | — | — | — | 0.667 | 0.020 | 0.000 | Tetragonal |
| 42 | — | — | 100 | 42 | 53 | 2.000 | 3.000 | — | — | — | 0.667 | 0.020 | 0.003 | Tetragonal |
| 43 | — | — | 100 | 42 | 53 | 2.000 | 3.000 | — | — | — | 0.667 | 0.020 | 0.020 | Tetragonal |
| 44 | — | — | 100 | 42 | 53 | 2.000 | 3.000 | — | — | — | 0.667 | 0.020 | 0.100 | Tetragonal |
| 45 | — | — | 100 | 42 | 53 | 2.000 | 3.000 | — | — | — | 0.667 | 0.020 | 0.120 | Tetragonal |
| 46 | — | — | 100 | 42 | 53 | 2.000 | 3.000 | — | — | — | 0.667 | 0.000 | 0.020 | Tetragonal |
| 47 | — | — | 100 | 42 | 53 | 2.000 | 3.000 | — | — | — | 0.667 | 0.003 | 0.020 | Tetragonal |
| 48 | — | — | 100 | 42 | 53 | 2.000 | 3.000 | — | — | — | 0.667 | 0.100 | 0.020 | Tetragonal |
| 49 | — | — | 100 | 42 | 53 | 2.000 | 3.000 | — | — | — | 0.667 | 0.120 | 0.020 | Tetragonal |

TABLE 3

| Sample No. | Pb Replacing Element Element | Pb Replacing Element Content of Element (Molar %) | Pb Content a (Molar Ratio) | Zr Content b (Molar Ratio) | Ti Content c (Molar Ratio) | Mn Content A (Molar Ratio) | Nb Content B (Molar Ratio) | Sb Content C (Molar Ratio) | Ta Content D (Molar Ratio) | W Content E (Molar Ratio) | A/ (B + C + D + 2E) | SiO$_2$ Content a (Parts by Weight) | Al$_2$O$_3$ Content b (Parts by Weight) | Crystal System |
|---|---|---|---|---|---|---|---|---|---|---|---|---|---|---|
| 50* | — | — | 100 | 48 | 47 | 1.500 | 3.000 | — | — | — | 0.500 | — | — | MPB |
| 51* | — | — | 100 | 48 | 47 | 1.530 | 3.000 | — | — | — | 0.510 | — | — | MPB |
| 52* | — | — | 100 | 48 | 47 | 1.575 | 3.000 | — | — | — | 0.525 | — | — | MPB |
| 53* | — | — | 100 | 48 | 47 | 2.000 | 3.000 | — | — | — | 0.667 | — | — | MPB |
| 54* | — | — | 100 | 48 | 47 | 3.000 | 3.000 | — | — | — | 1.000 | — | — | MPB |
| 55* | — | — | 100 | 48 | 47 | 3.100 | 3.000 | — | — | — | 1.033 | — | — | MPB |
| 56* | — | — | 100 | 53 | 42 | 1.500 | 3.000 | — | — | — | 0.500 | — | — | Rhombohedral |
| 57* | — | — | 100 | 53 | 42 | 1.530 | 3.000 | — | — | — | 0.510 | — | — | Rhombohedral |
| 58* | — | — | 100 | 53 | 42 | 1.575 | 3.000 | — | — | — | 0.525 | — | — | Rhombohedral |
| 59* | — | — | 100 | 53 | 42 | 2.000 | 3.000 | — | — | — | 0.667 | — | — | Rhombohedral |
| 60* | — | — | 100 | 53 | 42 | 3.000 | 3.000 | — | — | — | 1.000 | — | — | Rhombohedral |
| 61* | — | — | 100 | 53 | 42 | 3.100 | 3.000 | — | — | — | 1.033 | — | — | Rhombohedral |
| 62* | — | — | 100 | 47 | 48 | 1.500 | 3.000 | — | — | — | 0.500 | — | — | Tetragonal |
| 63 | — | — | 100 | 47 | 48 | 1.530 | 3.000 | — | — | — | 0.510 | — | — | Tetragonal |
| 64 | — | — | 100 | 47 | 48 | 1.575 | 3.000 | — | — | — | 0.525 | — | — | Tetragonal |
| 65 | — | — | 100 | 47 | 48 | 2.000 | 3.000 | — | — | — | 0.667 | — | — | Tetragonal |
| 66 | — | — | 100 | 47 | 48 | 3.000 | 3.000 | — | — | — | 1.000 | — | — | Tetragonal |
| 67 | — | — | 100 | 47 | 48 | 3.100 | 3.000 | — | — | — | 1.033 | — | — | Tetragonal |
| 68* | — | — | 100 | 37 | 58 | 1.500 | 3.000 | — | — | — | 0.500 | — | — | Tetragonal |
| 69 | — | — | 100 | 37 | 58 | 1.530 | 3.000 | — | — | — | 0.510 | — | — | Tetragonal |
| 70 | — | — | 100 | 37 | 58 | 1.575 | 3.000 | — | — | — | 0.525 | — | — | Tetragonal |
| 71 | — | — | 100 | 37 | 58 | 2.000 | 3.000 | — | — | — | 0.667 | — | — | Tetragonal |
| 72 | — | — | 100 | 37 | 58 | 3.000 | 3.000 | — | — | — | 1.000 | — | — | Tetragonal |
| 73 | — | — | 100 | 37 | 58 | 3.100 | 3.000 | — | — | — | 1.033 | — | — | Tetragonal |
| 74 | — | — | 93 | 42 | 53 | 2.000 | 3.000 | — | — | — | 0.667 | — | — | Tetragonal |
| 75 | — | — | 101 | 42 | 53 | 2.000 | 3.000 | — | — | — | 0.667 | — | — | Tetragonal |

Next, these molded parts were fired at 1,050 to 1,250° C. for 1 to 5 hours in an oxygen atmosphere, whereby sintered piezoelectric ceramic compacts were obtained. After lap polishing was performed for these sintered ceramic compacts, electrodes for polarization were formed thereon, and a polarizing treatment was performed by applying an electric field of 1 to 4 kV/mm for 30 to 60 minutes to the sintered ceramic compact placed in a silicone oil at a temperature of 80 to 100° C.

Concerning samples 6, 12, 18, 24, 30, 55, 61, 67 and 73, since the electrical insulating properties of sintered ceramic compacts thereof were decreased, the polarizing treatment under the conditions described above could not be performed. Accordingly, a polarizing treatment was performed by applying an electric field of 5.5 kV/mm for 30 minutes to each of the sintered ceramic compacts mentioned above placed in a silicone oil at a temperature decreased to 60° C.

Next, the polarized sintered ceramic compacts were cut into rectangular plates 5.1 mm long, 1.7 mm wide and 0.3 mm thick using a cutting tool so that the polarized direction thereof was along the longitudinal direction of the plate, and these cut plates were then polished. Piezoelectric properties in a shear vibration mode of the test pieces thus formed were evaluated. Tables 4-6 shows piezoelectric characteristics of samples 1-70.

In Tables 4 to 6, the electromechanical coupling coefficient $k_{15}$(%) in a saturated polarized state, electromechanical coupling coefficient $k_{15}$(%) in an unsaturated polarized state, resonant resistance $Z_r(\Omega)$, absolute value $|f_2-TC|$ (ppm/°C.) of the temperature coefficient of a resonant frequency $f_r$ in a temperature range of from −20 to 80° C., bending strength (MPa) by a three-point bending test, and individual variations (standard deviations) in electromechanical coupling coefficient $k_{15}$ and resonant frequency $f_r$, which were each obtained from fifteen test pieces, are shown.

In Tables 4 to 6, sample Nos. marked by * are comparative examples which are out of the scope of the present invention.

TABLE 4

| Sample No. | $K_{15}$ (Saturated Polarized State) (%) | $K_{15}$ (Unsaturated Polarized State) (%) | $Z_r$ ($\Omega$) | $|f_r\text{-TC}|$ (ppm/° C.) | Bending Strength (MPa) | $K_{15}$ Variation (%) | $f_r$ Variation (KHz) | Comment |
|---|---|---|---|---|---|---|---|---|
| 1* | 39 | 30 | 4.2 | 42 | 92 | 0.22 | 12 | |
| 2 | 39 | 30 | 4.1 | 40 | 90 | 0.12 | 13 | |
| 3 | 39 | 30 | 3.9 | 32 | 87 | 0.29 | 10 | |
| 4 | 42 | 29 | 3.8 | 25 | 92 | 0.24 | 10 | |
| 5 | 41 | 31 | 3.6 | 22 | 98 | 0.11 | 13 | |
| 6 | 41 | 31 | 3.7 | 20 | 99 | 0.12 | 11 | Change in Polarizing Conditions |
| 7* | 42 | 32 | 4.0 | 42 | 95 | 0.15 | 14 | |
| 8 | 42 | 32 | 3.9 | 40 | 93 | 0.24 | 13 | |
| 9 | 42 | 32 | 3.7 | 32 | 90 | 0.12 | 14 | |
| 10 | 41 | 31 | 3.6 | 25 | 95 | 0.18 | 13 | |
| 11 | 43 | 33 | 3.4 | 22 | 101 | 0.11 | 15 | |
| 12 | 42 | 33 | 3.5 | 20 | 100 | 0.11 | 11 | Change in Polarizing Conditions |
| 13* | 39 | 29 | 4.3 | 41 | 92 | 0.29 | 11 | |
| 14 | 39 | 29 | 4.2 | 40 | 90 | 0.14 | 11 | |
| 15 | 38 | 29 | 4.0 | 31 | 87 | 0.23 | 15 | |
| 16 | 37 | 28 | 3.9 | 24 | 92 | 0.13 | 15 | |
| 17 | 39 | 30 | 3.7 | 21 | 98 | 0.24 | 11 | |
| 18 | 40 | 30 | 3.8 | 19 | 98 | 0.23 | 13 | Change in Polarizing Conditions |
| 19* | 40 | 31 | 4.1 | 42 | 94 | 0.20 | 15 | |
| 20 | 40 | 31 | 4.0 | 40 | 92 | 0.17 | 12 | |
| 21 | 40 | 31 | 3.8 | 32 | 89 | 0.14 | 11 | |
| 22 | 39 | 30 | 3.7 | 25 | 94 | 0.22 | 10 | |
| 23 | 42 | 32 | 3.5 | 22 | 100 | 0.16 | 13 | |
| 24 | 41 | 32 | 3.6 | 20 | 101 | 0.17 | 12 | Change in Polarizing Conditions |

TABLE 5

| Sample No. | $K_{15}$ (Saturated Polarized State) (%) | $K_{15}$ (Unsaturated Polarized State) (%) | $Z_r$ ($\Omega$) | $|f_r\text{-TC}|$ (ppm/° C.) | Bending Strength (MPa) | $K_{15}$ Variation (%) | $f_r$ Variation (KHz) | Comment |
|---|---|---|---|---|---|---|---|---|
| 25* | 39 | 30 | 4.2 | 42 | 92 | 0.30 | 11 | |
| 26 | 39 | 30 | 4.1 | 40 | 80 | 0.29 | 14 | |
| 27 | 39 | 30 | 3.9 | 32 | 87 | 0.20 | 14 | |
| 28 | 38 | 29 | 3.8 | 25 | 92 | 0.17 | 10 | |
| 29 | 40 | 31 | 3.6 | 22 | 98 | 0.27 | 14 | |

TABLE 5-continued

| Sample No. | $K_{15}$ (Saturated Polarized State) (%) | $K_{15}$ (Unsaturated Polarized State) (%) | $Z_r$ ($\Omega$) | $|f_r\text{-TC}|$ (ppm/° C.) | Bending Strength (MPa) | $K_{15}$ Variation (%) | $f_r$ Variation (KH$_z$) | Comment |
|---|---|---|---|---|---|---|---|---|
| 30 | 41 | 31 | 3.6 | 20 | 97 | 0.26 | 11 | Change in Polarizing Conditions |
| 31 | 39 | 30 | 3.8 | 24 | 92 | 0.01 | 3 | |
| 32 | 42 | 32 | 3.9 | 25 | 92 | 0.01 | 3 | |
| 33 | 43 | 33 | 3.5 | 26 | 86 | 0.01 | 3 | |
| 34 | 57 | 44 | 3.6 | 25 | 98 | 0.04 | 6 | |
| 35 | 54 | 42 | 3.6 | 25 | 102 | 0.06 | 5 | |
| 36 | 59 | 38 | 3.9 | 27 | 100 | 0.05 | 6 | |
| 37 | 54 | 36 | 4.0 | 26 | 102 | 0.31 | 16 | |
| 38 | 39 | 30 | 3.9 | 26 | 99 | 0.01 | 3 | |
| 39 | 40 | 31 | 3.9 | 24 | 100 | 0.01 | 3 | |
| 40 | 42 | 32 | 3.9 | 25 | 101 | 0.01 | 3 | |
| 41 | 38 | 29 | 3.7 | 25 | 95 | 0.29 | 10 | |
| 42 | 37 | 28 | 3.8 | 25 | 105 | 0.30 | 11 | |
| 43 | 35 | 27 | 3.9 | 25 | 110 | 0.11 | 10 | |
| 44 | 35 | 27 | 4.5 | 25 | 115 | 0.14 | 11 | |
| 45 | 33 | 25 | 7.5 | 25 | 155 | 0.30 | 10 | |
| 46 | 38 | 29 | 3.7 | 25 | 95 | 0.22 | 11 | |
| 47 | 37 | 28 | 3.7 | 25 | 107 | 0.14 | 12 | |
| 48 | 34 | 26 | 4.8 | 25 | 122 | 0.29 | 10 | |
| 49 | 33 | 25 | 7.8 | 25 | 186 | 0.30 | 11 | |

TABLE 6

| Sample No. | $K_{15}$ (Saturated Polarized State) (%) | $K_{15}$ (Unsaturated Polarized State) (%) | $Z_r$ ($\Omega$) | $|f_r\text{-TC}|$ (ppm/° C.) | Bending Strength (MPa) | $K_{15}$ Variation (%) | $f_r$ Variation (KH$_z$) | Comment |
|---|---|---|---|---|---|---|---|---|
| 50* | 78 | 61 | 2.2 | 41 | 103 | 0.26 | 11 | |
| 51* | 78 | 61 | 2.1 | 42 | 96 | 0.14 | 13 | |
| 52* | 78 | 61 | 1.8 | 55 | 102 | 0.12 | 11 | |
| 53* | 77 | 60 | 1.7 | 69 | 104 | 0.21 | 15 | |
| 54* | 79 | 62 | 1.5 | 101 | 93 | 0.22 | 13 | |
| 55* | 77 | 61 | 1.6 | 103 | 104 | 0.22 | 13 | Change in Polarizing Conditions |
| 56* | 55 | 43 | 3.5 | 45 | 102 | 0.15 | 11 | |
| 57* | 55 | 43 | 3.1 | 44 | 104 | 0.23 | 14 | |
| 58* | 53 | 41 | 3.0 | 46 | 99 | 0.22 | 14 | |
| 59* | 53 | 41 | 3.1 | 46 | 93 | 0.20 | 13 | |
| 60* | 59 | 46 | 3.2 | 44 | 96 | 0.26 | 12 | |
| 61* | 60 | 46 | 3.1 | 46 | 100 | 0.24 | 12 | Change in Polarizing Conditions |
| 62* | 53 | 33 | 4.0 | 53 | 102 | 0.22 | 12 | |
| 63 | 53 | 33 | 3.9 | 51 | 103 | 0.26 | 11 | |
| 64 | 53 | 33 | 3.7 | 39 | 102 | 0.20 | 12 | |
| 65 | 52 | 32 | 3.6 | 36 | 103 | 0.18 | 14 | |
| 66 | 44 | 34 | 3.4 | 33 | 104 | 0.28 | 13 | |
| 67 | 43 | 33 | 3.4 | 31 | 101 | 0.26 | 11 | Change in Polarizing Conditions |
| 68* | 38 | 29 | 3.9 | 44 | 104 | 0.14 | 11 | |
| 69 | 39 | 30 | 4.0 | 42 | 103 | 0.13 | 12 | |
| 70 | 38 | 29 | 3.9 | 34 | 100 | 0.26 | 13 | |
| 71 | 39 | 30 | 4.1 | 27 | 104 | 0.12 | 15 | |
| 72 | 42 | 32 | 3.9 | 24 | 103 | 0.25 | 11 | |
| 73 | 43 | 31 | 4.0 | 22 | 102 | 0.24 | 12 | Change in Polarizing Conditions |
| 74 | 36 | 28 | 4.0 | 28 | 104 | 0.19 | 12 | |
| 75 | 39 | 31 | 3.9 | 27 | 110 | 0.28 | 11 | |

Figure 4:
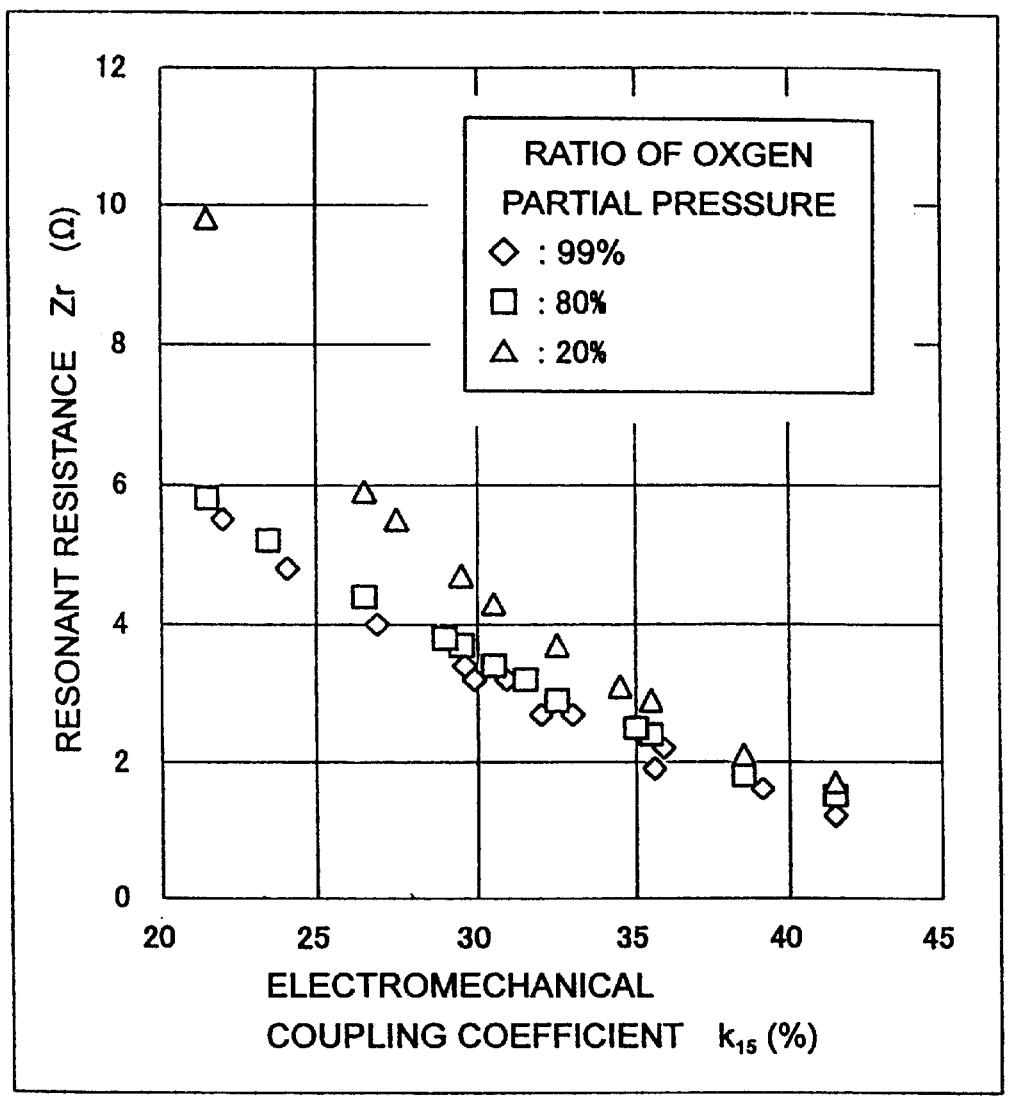
FIG. 4 is a view showing the relationship between the electromechanical coupling coefficient and the resonant resistance when the degree of polarization is decreased in the case in which the ratio of oxygen partial pressure is changed in a firing atmosphere for forming a sintered piezoelectric ceramic compact having a composition prepared in an example of the present invention.

In FIG. 4, the relationships between the electromechanical coupling coefficient $K_{15}$ and the resonant resistance $Z_r$ of a test piece having a composition and a crystal system of sample 4 (Table 1) are shown. The relationships described above were obtained when the oxygen concentrations in the firing atmosphere, that is, ratios of the oxygen partial pressure to the total pressure, were 99, 80 and 20%, and when the degree of polarization was decreased.

FIG. 4 shows that at a degree of polarization at which the same electromechanical coupling coefficients $K_{15}$ were obtained, the resonant resistance $Z_r$ obtained by firing in an oxygen atmosphere at a ratio of oxygen partial pressure of about 80% or more (an oxygen concentration of about 80 volume percent or more) was lower compared to that obtained at a ratio of an oxygen partial pressure of 20% (i.e., the case in which no atmosphere control was performed). Accordingly, when a sintered ceramic compact having a low electromechanical coupling coefficient is formed by controlling the degree of polarization, by firing in an atmosphere at a ratio of an oxygen partial pressure of about 80% or more, a sintered body having a low resonant resistance, that is, a low loss, can be obtained.

Referring to Tables 1 to 6, when samples are compared to each other which have a tetragonal crystal system, contain the same elements, and have different ratios of the Ma content X to the Md content Y, that is, different A/(B+C+D+2E), in other words, when comparison is performed between samples 1 to 6, between samples 7 to 12, between samples 13 to 18, between samples 19 to 24, between samples 25 to 30, between samples 62 to 67, and between samples 68 to 73, respectively, samples within the scope of the present invention, that is, samples having A/(B+C+D+2E) larger than 0.500 had a low temperature coefficient |fr−TC| of the resonant frequency $f_r$ compared to samples having a stoichiometric ratio of 0.500, whereby it is understood that the temperature stability of the resonant frequency was improved.

In addition, even though A/(B+C+D+2E) was more than the 0.500 stoichiometric ratio in samples 50 to 61, the effect of improving temperature stability of the resonant frequency could not be obtained.

As can be seen when a comparison is performed between samples 62 to 73 and between samples 1 to 30, by increasing A/(B+C+D+2E) described above to more than the stoichiometric ratio, the temperature stability of the resonant frequency could be improved even though the Zr content b and the Ti content c were changed.

When A/(B+C+D+2E)<0.525in the tetragonal crystal system samples 1, 2, 7, 8, 13, 14, 19, 20, 25, 26, 62, 63, 68 and 69, $|f_r–TC|$ is increased to 40 ppm/°C. or more, and hence they are not so suitable for forming a sintered piezoelectric ceramic compact for use in a narrow bandwidth filter which is required to have higher accuracy of temperature dependence of the resonant frequency.

When A/(B+C+D+2E)>1, as were the cases of samples 6, 12, 18, 24, 30, 67 and 73, a polarizing treatment cannot be easily performed under typical polarizing conditions.

In addition, the element Pb in the primary component of the composition of sample 4 was replaced in samples 31 to 40 by at least one selected from the group consisting of Ca, Ba, Sr and La. Accordingly, when sample 4 is compared to samples 31 to 40, the effect of replacement described above can be confirmed. That is, in sample 4 in which the element Pb was not replaced, the variation of $k_{15}$ was 0.24%, and on the other hand, in samples 31 to 36 and in samples 38 to 40 in which about 20 mole percent or less of the element Pb in the primary component was replaced by at least one selected from the group consisting of Ca, Ba, Sr and La, the variation of $k_{15}$ could be decreased to 0.01 to 0.06%. In particular, according to samples 31 to 33 and 38 to 40 in which about 1 to 4 mole percent of the element Pb was replaced, the variation of $k_{15}$ could be decreased to 0.01%.

In addition, the variation of $f_r$ was also preferably influenced by replacement of the element Pb by at least one selected from the group consisting of Ca, Ba, Sr and La. That is, in sample 4 in which the replacement described above was not performed, the variation of $f_r$ was 10 kHz, and on the other hand, in samples 31 to 36 and in samples 38 to 40, in which about 20 mole percent or less of the element Pb in the primary component was replaced by at least one selected from the group consisting of Ca, Ba, Sr and La, the variation of $f_r$ could be decreased to 3 to 6 kHz. In particular, according to samples 31 to 33 and 38 to 40 in which about 1 to 4 mole percent of the element Pb was replaced, the variation of $f_r$ could be decreased to 3 kHz.

According to sample 37 in which about 20 mole percent or more of the element Pb was replaced, the Curie temperature was decreased, and hence the sample was easily influenced by heat. Accordingly, the variations of $k_{15}$ and $f_r$ were increased.

The effect of adding $SiO_2$ and $Al_2O_3$ to the primary component of the piezoelectric ceramic material can be confirmed by comparing between samples 41 to 49 and sample 4 having a composition equivalent thereto except that the compounds mentioned above were not present.

When the bending strengths are compared, sample 4 had a bending strength of 92 MPa while samples 41 to 49 had bending strengths of 95 MPa or more.

According to samples 42 to 45 and 47 to 49, which contained 0.003 parts by weight or more of $SiO_2$ and 0.003 parts by weight or more of $Al_2O_3$, the bending strengths were increased to 105 MPa or more.

According to samples 45 and 49 containing $SiO_2$ and $Al_2O_3$ at a content of more than 0.1 parts by weight, respectively, the sintering properties were degraded, and in addition, the resonant resistance was increased to more than 5 Ω. As a result, the contents of $SiO_2$ and $Al_2O_3$ are preferably about 0.1 parts by weight or less.

The Pb content a contained in the piezoelectric ceramic material of the present invention has a certain level of tolerance. That is, as seen in the cases of samples 74 and 75, even when the Pb content a was changed within the range of 93 to 101 mol, the properties of the sintered piezoelectric ceramic compact were not significantly influenced. In this connection, when the Pb content a was increased more than the range mentioned above, deformation of the sintered ceramic compact easily occurred, and on the other hand, when the content was decreased to less than the range mentioned above, it was understood that a satisfactory dense sintered ceramic compact was difficult to obtain.

The present invention was described heretofore with reference to particular examples; however, the piezoelectric ceramic material of the present invention and the sintered piezoelectric ceramic compact obtained by firing the same are not limited to the examples described above, and within the scope of the present invention, various modifications can be performed.

In addition, the vibration mode, which is used in the piezoelectric ceramic device formed by using the sintered piezoelectric ceramic compact of the present invention, is not limited to a shear vibration mode, and for example, a spreading vibration mode, a thickness extensional vibration mode or a surface wave may also be used. Accordingly, the present invention can be applied to any type of vibration mode.

Furthermore, the sintered piezoelectric ceramic compact of the present invention is not only applied to a filter or an oscillator but is also applied to another device using piezoelectric properties, such as a trap device. In particular, the sintered piezoelectric ceramic compact of the present invention can be advantageously applied to applications in which a low electromechanical coupling coefficient and superior temperature properties are required.

As has thus been described, the piezoelectric ceramic material of the present invention comprises a solid solution having a primary component composed of $PbTiO_3$, $PbZrO_3$ and $Pb(Ma_xMd_y)O_3$, in which Ma is one or more bivalent or trivalent elements, and Md is one or more pentavalent or hexavalent elements, wherein the solid solution has a tetragonal crystal system, and the ratio X/Y, which is the ratio of the Ma content X to the Md content Y, is larger than the stoichiometric ratio. As can be seen from the results of the examples described above, the temperature dependence of the resonant frequency can be decreased in a sintered piezoelectric ceramic compact obtained by fining the piezoelectric ceramic material. As a result, a piezoelectric ceramic device such as a filter can be obtained having a superior temperature stability of the resonant frequency by using the sintered piezoelectric ceramic compact.

In the piezoelectric ceramic material according to the present invention, the effect of improving the temperature stability of the resonant frequency is more significant in the case in which Ma is Mn, and Md is at least one selected from the group consisting of Nb, Sb, Ta and W, and when the contents thereof are represented by A, B, C, D and E, $0.525 \leq A/(B+C+D+2E) \leq 1$ on a molar basis, and in addition, a polarization treatment can be more easily performed.

When from more than zero to about 20 mole percent of the element Pb contained in the primary component in the piezoelectric ceramic material of the present invention, is replaced by one or more of Ca, Ba, Sr and La, the effect of decreasing variations in electromechanical coupling coefficient and resonant frequency can be improved.

Also when 0.003 to 0.1 parts by weight of $SiO_2$ and 0.003 to 0.1 parts by weight of $Al_2O_3$ are in the piezoelectric ceramic material of the present invention, are present with respect to 100 parts by weight of the primary component, the strength of an obtained sintered piezoelectric ceramic compact can be improved.

When a sintered piezoelectric ceramic compact is formed by firing the piezoelectric ceramic material of the present invention in an oxygen atmosphere at an oxygen concentration of about 80 percent by volume or more, even though the sintered piezoelectric ceramic compact is in an unsaturated polarized state having an electromechanical coupling coefficient corresponding to about 80% or less of that of a sintered piezoelectric ceramic compact in a saturated polarized state, the resonant resistance is not significantly increased. In addition, when a filter is formed by using the sintered piezoelectric ceramic compact described above, the insertion loss thereof can be decreased.

Accordingly, when a sintered piezoelectric ceramic compact is placed in an unsaturated polarized state having an electromechanical coupling coefficient corresponding to about 80% or less of that of a sintered piezoelectric ceramic compact in a saturated polarized state, a piezoelectric ceramic device required to have a low electromechanical coupling coefficient such as a narrow bandwidth filter, can be obtained by using this sintered piezoelectric ceramic compact.

What is claimed is:

1. A piezoelectric ceramic material comprising a solid solution having a primary component composed of $PbTiO_3$, $PbZrO_3$, and $Pb(Ma_xMd_y)O_3$, in which up to about 20 mole percent of the Pb is replaced by at least one member selected from the group consisting of Ca, Ba, Sr and La, Ma is at least one member selected from the group consisting of bivalent elements and trivalent elements, and Md is at least one member selected from the group consisting of pentavalent elements and hexavalent elements,
   wherein the solid solution has a tetragonal crystal system, and
   the ratio of the Ma content X to the Md content Y is larger than the stoichiometric ratio.

2. A piezoelectric ceramic material according to claim 1, wherein Ma is Mn, and Md is at least one selected from the group consisting of Nb, Sb, Ta and W.

3. A piezoelectric ceramic material according to claim 2, wherein, when the molar contents of Mn, Nb, Sb, Ta and W are represented by A, B, C, D and E, respectively, $0.525 \leq A/(B+C+D+2E) \leq 1$.

4. A piezoelectric ceramic material according to claim 3, wherein more than zero mole percent of the Pb contained in the primary component is replaced by at least one member selected from the group consisting of Ca, Ba, Sr and La.

5. A piezoelectric ceramic material according to claim 4, wherein about 1 to 4 mole percent of the Pb contained in the primary component is replaced by at least one member selected from the group consisting of Ca, Ba, Sr and La.

6. A piezoelectric ceramic material according to claim 5, further comprising about 0.003 to 0.1 parts by weight of $SiO_2$ and about 0.003 to 0.1 parts by weight of $Al_2O_3$ with respect to 100 parts by weight of the primary component.

7. A piezoelectric ceramic material according to claim 1, wherein more than zero mole percent of the Pb contained in the primary component is replaced by at least one member selected from the group consisting of Ca, Ba, Sr and La.

8. A piezoelectric ceramic material according to claim 7, wherein about 1 to 4 mole percent of the Pb contained in the primary component is replaced by at least one member selected from the group consisting of Ca, Ba, Sr and La.

9. A piezoelectric ceramic material according to claim 8, further comprising about 0.003 to 0.1 parts by weight of $SiO_2$ and about 0.003 to 0.1 parts by weight of $Al_2O_3$ with respect to 100 parts by weight of the primary component.

10. A piezoelectric ceramic material according to claim 1, further comprising about 0.003 to 0.1 parts by weight of $SiO_2$ and about 0.003 to 0.1 parts by weight of $Al_2O_3$ with respect to 100 parts by weight of the primary component.

11. A sintered piezoelectric ceramic compact comprising a piezoelectric ceramic material according to claim 10 which has been fired in an atmosphere of at least about 80% oxygen concentration.

12. A sintered piezoelectric ceramic compact comprising a piezoelectric ceramic material according to claim 6 which has been fired in an atmosphere of at least about 80% oxygen concentration.

13. A sintered piezoelectric ceramic compact comprising a piezoelectric ceramic material according to claim 1 which has been fired in an atmosphere of at least about 80% oxygen concentration.

14. A sintered piezoelectric ceramic compact according to claim 13, wherein the sintered piezoelectric ceramic compact is in an unsaturated polarized state having an electromechanical coupling coefficient corresponding to about 80% or less of that of a sintered piezoelectric ceramic compact in a saturated polarized state.

15. A piezoelectric ceramic device comprising a sintered piezoelectric ceramic compact according to claim 14 in combination with surface electrodes.

16. A sintered piezoelectric ceramic compact of claim 1 in an unsaturated polarized state and having an electromechanical coupling coefficient corresponding to about 80% or less of that of a sintered piezoelectric ceramic compact in a saturated polarized state.

17. A piezoelectric ceramic device comprising a sintered piezoelectric ceramic compact according to claim 16 in combination with surface electrodes.

18. A sintered piezoelectric ceramic compact of claim 6 in an unsaturated polarized state and having an electromechanical coupling coefficient corresponding to about 80% or less of that of a sintered piezoelectric ceramic compact in a saturated polarized state.

19. A sintered piezoelectric ceramic compact of claim 10 in an unsaturated polarized state and having an electromechanical coupling coefficient corresponding to about 80% or less of that of a sintered piezoelectric ceramic compact in a saturated polarized state.

* * * * *